US010431732B2

(12) United States Patent
Bharat et al.

(10) Patent No.: US 10,431,732 B2
(45) Date of Patent: Oct. 1, 2019

(54) SHIELDED MAGNETORESISTIVE RANDOM ACCESS MEMORY DEVICES AND METHODS FOR FABRICATING THE SAME

(71) Applicants: Globalfoundries Singapore Pte. Ltd., Singapore (SG); Institute of Microelectronics, Singapore (SG)

(72) Inventors: Bhushan Bharat, Singapore (SG); Shan Gao, Singapore (SG); Danny Pak-Chum Shum, Singapore (SG); Wanbing Yi, Singapore (SG); Juan Boon Tan, Singapore (SG); Wei Yi Lim, Singapore (SG); Teck Guan Lim, Singapore (SG); Michael Han Kim Kwong, Singapore (SG); Eva Wai Leong Ching, Singapore (SG)

(73) Assignees: GLOBALFOUNDRIES SINGAPORE PTE. LTD., Singapore (SG); AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 15 days.

(21) Appl. No.: 15/609,621

(22) Filed: May 31, 2017

(65) Prior Publication Data
US 2018/0351078 A1 Dec. 6, 2018

(51) Int. Cl.
*H01L 27/22* (2006.01)
*H01L 23/00* (2006.01)
(Continued)

(52) U.S. Cl.
CPC .............. *H01L 43/02* (2013.01); *H01L 23/13* (2013.01); *H01L 23/552* (2013.01); *H01L 24/29* (2013.01);
(Continued)

(58) Field of Classification Search
CPC ....... H01L 43/02; H01L 23/13; H01L 23/552; H01L 24/49; H01L 27/222; H01L 43/08; H01L 43/12; H01L 2224/32225; H01L 2224/48106; H01L 2224/48227; H01L 2224/73215; H01L 2924/1443; H01L 2924/3025
(Continued)

(56) References Cited

U.S. PATENT DOCUMENTS

| 6,936,763 B2 | 8/2005 | Rizzo et al. |
| 7,105,363 B2 | 9/2006 | Durlam et al. |

(Continued)

*Primary Examiner* — Didarul A Mazumder
(74) *Attorney, Agent, or Firm* — Lorenz & Kopf, LLP

(57) ABSTRACT

Shielded semiconductor devices and methods for fabricating shielded semiconductor devices are provided. An exemplary magnetically shielded semiconductor device includes a substrate having a top surface and a bottom surface. An electromagnetic-field-susceptible semiconductor component is located on and/or in the substrate. The magnetically shielded semiconductor device includes a top magnetic shield located over the top surface of the substrate. Further, the magnetically shielded semiconductor device includes a bottom magnetic shield located under the bottom surface of the substrate. Also, the magnetically shielded semiconductor device includes a sidewall magnetic shield located between the top magnetic shield and the bottom magnetic shield.

20 Claims, 4 Drawing Sheets

(51) Int. Cl.
- *H01L 43/02* (2006.01)
- *H01L 23/13* (2006.01)
- *H01L 23/552* (2006.01)
- *H01L 23/498* (2006.01)

(52) U.S. Cl.
CPC .............. *H01L 24/32* (2013.01); *H01L 24/49* (2013.01); *H01L 27/222* (2013.01); *H01L 23/49827* (2013.01); *H01L 24/48* (2013.01); *H01L 24/73* (2013.01); *H01L 24/92* (2013.01); *H01L 2224/2919* (2013.01); *H01L 2224/2929* (2013.01); *H01L 2224/32225* (2013.01); *H01L 2224/4824* (2013.01); *H01L 2224/48091* (2013.01); *H01L 2224/48106* (2013.01); *H01L 2224/48227* (2013.01); *H01L 2224/73215* (2013.01); *H01L 2224/73265* (2013.01); *H01L 2224/92147* (2013.01); *H01L 2924/00014* (2013.01); *H01L 2924/1435* (2013.01); *H01L 2924/1443* (2013.01); *H01L 2924/15311* (2013.01); *H01L 2924/16152* (2013.01); *H01L 2924/3025* (2013.01)

(58) Field of Classification Search
USPC .................................. 257/421, 422; 438/48
See application file for complete search history.

(56) References Cited

U.S. PATENT DOCUMENTS

| | | |
|---|---|---|
| 7,598,596 B2 | 10/2009 | Molla et al. |
| 2011/0062539 A1* | 3/2011 | Matsuda ................ B82Y 25/00 257/422 |
| 2012/0193737 A1 | 8/2012 | Pang et al. |
| 2012/0197505 A1 | 8/2012 | Friesen et al. |
| 2016/0091575 A1* | 3/2016 | Yamada ............. G01R 33/0017 324/225 |
| 2016/0172580 A1* | 6/2016 | Matsubara ............ H01L 23/552 257/422 |
| 2016/0351792 A1* | 12/2016 | Jiang ....................... H01L 43/02 |

* cited by examiner

SHIELDED MAGNETORESISTIVE RANDOM ACCESS MEMORY DEVICES AND METHODS FOR FABRICATING THE SAME

TECHNICAL FIELD

The technical field generally relates to semiconductor devices, and more particularly relates semiconductor devices provided with magnetic shielding.

BACKGROUND

Interference from external magnetic fields is a serious problem in semiconductor devices that include magnetic materials, such as magnetoresistive random access memory (hereinafter referred to as "MRAM") devices, or the like. Typically, such devices utilize the orientation of a magnetization vector for device operation. In MRAM devices, the stability of the nonvolatile memory state, the repeatability of the read/write cycles, and the memory element-to-element switching field uniformity are three of the most important aspects of its design characteristics. These characteristics depend on the behavior and properties of the magnetization vector.

Storing data in a MRAM device is accomplished by applying magnetic fields and causing a magnetic material in the MRAM device to be magnetized into one of two possible magnetization states. Recalling data is accomplished by sensing the resistive differences in the MRAM device between the two states. The magnetic fields for writing, or imparting a particular magnetization orientation to the magnetic material, are created by passing currents through conductive lines external to the magnetic structure or through the magnetic structures themselves.

If a magnetic field is applied to a MRAM device during writing, then the total field incident to the MRAM device may be less than that required for writing. This condition can cause programming errors. In addition, a typical MRAM architecture has multiple bits that are exposed to magnetic fields when one MRAM device is programmed. These one-half selected MRAM devices are particularly sensitive to unintended programming from an external magnetic field. Further, if the magnetic field is large enough, MRAM devices may be unintentionally switched by the external magnetic field even in the absence of a programming current.

One approach to decrease the effects of magnetic field interference is to magnetically shield the electronic circuit components. Conventional magnetic shielding solutions are often too expensive and not easily integrated with the MRAM devices.

In view of the foregoing, it is desirable to provide a semiconductor device with improved shielding. Furthermore, it is also desirable to provide a method for fabricating such magnetically shielded semiconductor devices that is cost effective and compatible with logic fabrication stages. Furthermore, other desirable features and characteristics will become apparent from the subsequent detailed description and the appended claims, taken in conjunction with the accompanying drawings and this background.

BRIEF SUMMARY

Magnetically shielded semiconductor devices and methods for fabricating magnetically shielded semiconductor devices are provided. An exemplary magnetically shielded semiconductor device includes a substrate having a top surface and a bottom surface. An electromagnetic-field-susceptible semiconductor component is located on and/or in the substrate. The magnetically shielded semiconductor device includes a top magnetic shield located over the top surface of the substrate. Further, the magnetically shielded semiconductor device includes a bottom magnetic shield located under the bottom surface of the substrate. Also, the magnetically shielded semiconductor device includes a sidewall magnetic shield located between the top magnetic shield and the bottom magnetic shield.

In another exemplary embodiment, a magnetically shielded semiconductor device includes a cup-shaped magnetic shield defining a hollow. The magnetically shielded semiconductor device further includes a magnetoresistive random access memory (MRAM) die located at least partially within the hollow of the cup-shaped magnetic shield. Also, the magnetically shielded semiconductor device includes another magnetic shield located over the MRAM die.

In yet another exemplary embodiment, a method for fabricating a magnetically shielded semiconductor device is provided. An exemplary method includes attaching a magnetoresistive random access memory (MRAM) die to a central portion of a top magnetic shield. The method also includes attaching the top magnetic shield to a package substrate. Further, the method includes bonding a bottom magnetic shield to the MRAM die and to a peripheral portion of the top magnetic shield with a magnetic epoxy.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
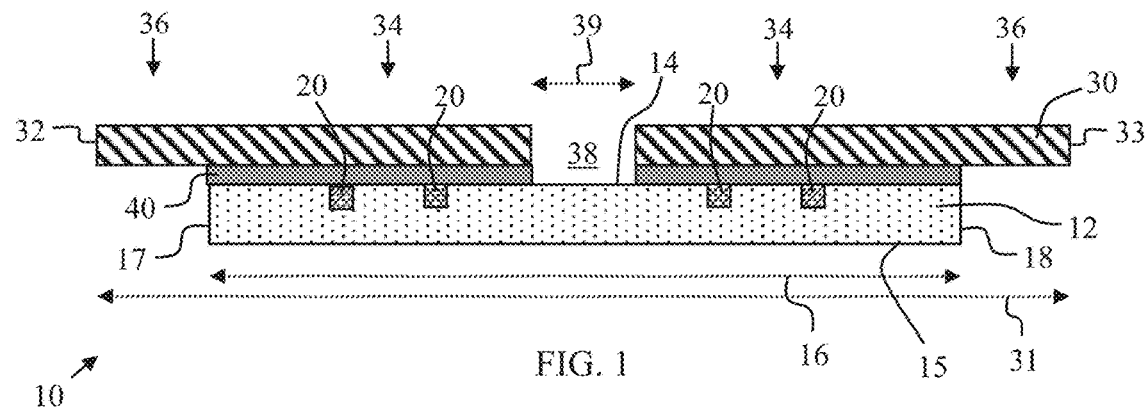
FIGS. 1, 5, 6, 8 and 9 are cross-sectional views illustrating a process for forming a shielded semiconductor device in accordance with embodiments herein.

The following detailed description is merely exemplary in nature and is not intended to limit the shielded semiconductor devices or methods for fabricating shielded semiconductor devices. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components within the overall device.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer.

Generally, the integrated circuit can be operated in any orientation. However, it is noted that the orientation of the drawings show fabrication processing of a MRAM device layer after the layer has been flipped. Spatially relative terms, such as "top", "bottom", "over" and "under" are made in the context of the MRAM device layer for ease of description to describe one element or feature's relationship to the MRAM device layer. Thus, the top shield is illustrated at the bottom of the figures, while the bottom shield is illustrated at the top of the figures. It will be understood that the spatially relative terms are intended to encompass different orientations of the device in use or operation in addition to the orientation depicted in the figures. Thus, the exemplary terms "over" and "under" can each encompass either an orientation of above or below depending upon the orientation of the device. The device may be otherwise oriented (e.g., rotated 90 degrees or at other orientations) and the spatially relative descriptors used herein may likewise be interpreted accordingly. As used herein, a "material layer" is a layer that includes at least 60 wt. % of the identified material. For example, a nickel-iron layer is a layer that is at least 60 wt. % nickel and iron. Likewise, a feature that "includes" a "material" includes at least 60 wt. % of the identified material. For example, a layer that includes nickel-iron is a layer that includes at least 60 wt. % nickel-iron.

Embodiments of the present disclosure generally relate to magnetically shielded devices. In one embodiment, the magnetically shielded devices are perpendicular magnetoresistive random access memory (p-MRAM) devices. An exemplary magnetoresistive memory cell includes a perpendicular magnetic tunnel junction (pMTJ) storage unit.

Other suitable types of magnetically shielded devices may also be useful and may be incorporated into standalone memory devices including, but not limited to, USB or other types of portable storage units, or integrated circuits (ICs), such as microcontrollers or system on chips (SoCs). The devices may be incorporated into or used with, for example, consumer electronic products, or relate to other types of devices.

In an exemplary embodiment, the MRAM device is provided with magnetic shielding in all directions, such that the magnetic shielding encompasses the entire MRAM device. For example, the MRAM device may be located within a hollow of a cup-shaped bottom magnetic shield such that the MRAM device is shielded along a bottom side and along each lateral side. Further, the MRAM device may be located below a top magnetic shield such that the MRAM device is shielded along a top side. A small opening may be provided in the top magnetic shield to allow for electrical connection to the MRAM device surrounded by shielding. In exemplary embodiments, the opening is not aligned with any MRAM device within the hollow of the shield.

FIGS. 1, 5-6, and 8-9 are cross-sectional views illustrating a process for forming a shielded semiconductor device 10 according to an exemplary embodiment. In FIG. 1, a substrate 12 is provided. An exemplary substrate 12 is a silicon, silicon carbide, quartz or sapphire wafer. The substrate 12 may alternatively be a ZnO substrate, a nitride semiconductor substrate, or a substrate of another suitable material. The substrate 12 includes a top or first surface 14 and an opposite bottom or second surface 15. An exemplary substrate 12 has a thickness of from about 0.1 to about 0.3 mm, such as about 0.2 mm. Further, the substrate 12 has a length 16 from a first edge 17 to a second edge 18. In an exemplary embodiment, the length 16 is from about 7 to about 9 mm, such as about 8.235 mm.

Electromagnetic-field-susceptible semiconductor components 20 are located on and/or in the substrate 12. As used herein, electromagnetic-field-susceptible semiconductor component refers to a component that is susceptible to or otherwise requires protection from externally-generated electromagnetic fields. In an exemplary embodiment, an electromagnetic-field-susceptible semiconductor component 20 is a bank or array of magnetic tunnel junction (MTJ) cells.

In an exemplary embodiment, each semiconductor component 20 is located at the top surface 14 of the substrate 12. An exemplary semiconductor component 20 includes a ferromagnetic memory cell, such as an MRAM component, for example, a plurality of MRAM bits. In an exemplary embodiment, the semiconductor component 20 is a perpendicular MRAM component including pMTJ units. In an exemplary embodiment, the substrate 12 is formed by dicing a wafer on which MRAM components are formed, and may be considered to be a MRAM die. Also, it will be understood that while four semiconductor components 20 are illustrated for convenience, a complete array of devices or control/driver circuits around the periphery of an array of magnetic memory bits may be formed in and/or on the substrate 12. Further, the substrate 12 typically includes interconnects and contact pads capable of transmitting signals to and from semiconductor components 20, but these interconnects and contact pads are not illustrated for simplicity.

As shown in FIG. 1, the top surface 14 of the substrate 12 is disposed over a top magnetic shield 30. For example, the top surface 14 of the substrate 12 may be attached to the top magnetic shield 30. As used herein, a "magnetic shield" is a material that provides a low reluctance path for magnetic flux. An exemplary top magnetic shield 30 includes a magnetic nickel iron (NiFe) alloy, e.g., an electrodeposited "permalloy" or "mumetal" layer. Permalloy is nominally composed of 80% Ni and 20% Fe. Mumetal typically includes magnetic alloys of nickel, iron, molybdenum, manganese, and silicon, and is nominally composed of 80% Ni, 13.5% Fe, 4.9% Mo, 0.5% Mn, and 0.3% Si. In other embodiments, the top magnetic shield 30 includes a composite material formed of a magnetically-permeable filler material dispersed within a base matrix. Exemplary magnetic permeable filler material may include nickel, iron, nickel-iron and nickel-iron-molybdenum alloys, among other suitable materials. An exemplary base matrix includes at least one of an organic compound and a metal. The base matrix may include composites of organic resins such as epoxy resin, acrylic resin, polyester resin, and polycarbonate.

The exemplary top magnetic shield 30 has a thickness of from about 0.15 to about 0.5 mm, such as about 0.35 mm. Further, the top magnetic shield 30 has a length 31 from a first end 32 to a second end 33. As shown, length 31 of the top magnetic shield 30 is greater than the length 16 of the substrate 12. In an exemplary embodiment, the length 31 of the top magnetic shield 30 is from about 8 to about 10 mm, such as about 9.035 mm.

The top magnetic shield 30 includes a central portion 34, and a peripheral portion 36 located between the central portion 34 and each end 32 and 33. In an embodiment and as shown in FIG. 1, the substrate 12 is attached to the central portion 34 of the top magnetic shield 30. As further shown, the top magnetic shield 30 is formed with an opening 38. Opening 38 extends completely through the top magnetic shield 30 to expose the first surface 14 of the substrate 12. In an exemplary embodiment, the opening 38 has a length 39 of from about 0.5 to about 1.0 mm, such as about 0.7 mm.

Figure 2:
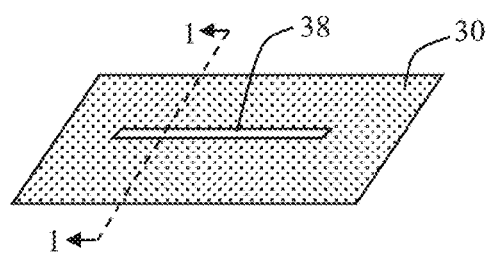
FIGS. 2-4 are perspective views of exemplary top magnetic shields for use in the shielded semiconductor device of FIGS. 1, 5, 6, 8 and 9 in accordance with embodiments herein.
Figure 3:
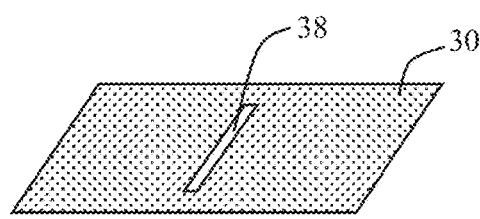
Figure 4:
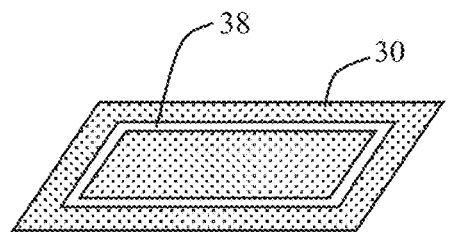

Referring to FIGS. 2-4, the configuration of the top magnetic shield 30 may be understood by the various different embodiments that are illustrated. FIG. 2 illustrates an embodiment of a top magnetic shield 30 including a single longitudinal slot opening 38. The cross-section view of FIG. 1 may be considered to be taken along line 1-1 in FIG. 2. FIG. 3 illustrates an embodiment of a top magnetic shield 30 including a single lateral slot opening 38, perpendicular to the orientation of the opening 38 as shown in the embodiment of FIG. 2. FIG. 4 illustrates another embodiment in which the top magnetic shield 30 includes a rectilinear annular slot opening 38. Other suitable configurations of the opening 38 may be used.

Referring back to FIG. 1, in an exemplary embodiment, the top magnetic shield 30 is attached to the substrate 12 with a die attach adhesive 40. For example, the die attach adhesive 40 may be a non-magnetic epoxy or a magnetic epoxy. Other suitable materials may be utilized for the die attach adhesive 40. In an exemplary embodiment, the die attach adhesive 40 has a thickness of from about 0.01 to about 0.05 mm, such as about 0.02 mm.

Figure 5:
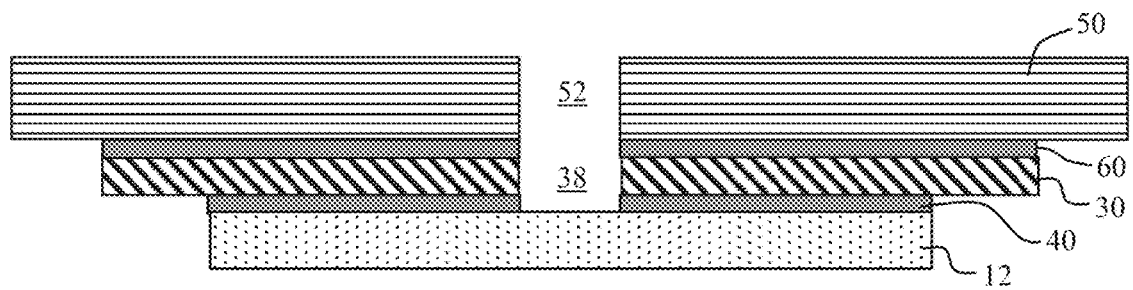

In FIG. 5, a package substrate 50 is disposed over the top magnetic shield 30. For example, package substrate 50 may be directly attached to the top magnetic shield 30. The exemplary package substrate 50 may include organic, inorganic, ceramic and glass package substrate materials. Further, exemplary package substrate 50 may be a semiconductor substrate encompassing semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. In an exemplary embodiment, the semiconductor material is a silicon substrate, such as crystalline silicon.

As shown, the package substrate 50 has an opening 52 that is the same size as, and aligned with, the opening 38 in the top magnetic shield 30. In an exemplary embodiment, the package substrate 50 has a thickness of from about 0.2 to about 0.5 mm, such as about 0.3 mm. In an exemplary embodiment, the package substrate 50 has a length of from about 9 to about 12 mm, such as about 10 mm.

In an exemplary embodiment, the package substrate 50 is attached to the top magnetic shield 30 using an adhesive 60. For example, the adhesive 60 may be a non-magnetic epoxy or a magnetic epoxy. Other suitable materials may be utilized for the adhesive 60. In an exemplary embodiment, the adhesive 60 has a thickness of from about 0.01 to about 0.05 mm, such as about 0.02 mm.

Figure 6:
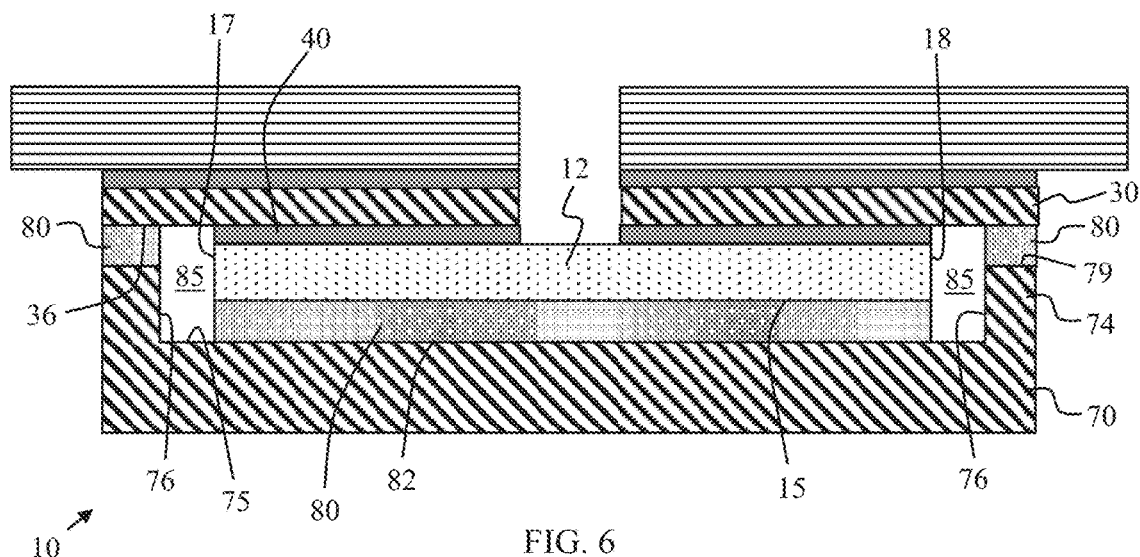

As shown in FIG. 6, a bottom magnetic shield 70 is disposed over the substrate 12. For example, the bottom magnetic shield 70 is attached to the substrate 12 and to the top magnetic shield 30. An exemplary bottom magnetic shield 70 includes a magnetic nickel iron (NiFe) alloy, e.g., an electrodeposited "permalloy" or "mumetal" layer. In other embodiments, the bottom magnetic shield 70 includes a composite material formed of a magnetic permeable filler material dispersed within a base matrix. Exemplary magnetic permeable filler material may include nickel, nickel-iron and nickel-iron-molybdenum alloys, among other suitable materials. An exemplary base matrix includes at least one of an organic compound and a metal. The base matrix may include composites of organic resins such as epoxy resin, acrylic resin, polyester resin, and polycarbonate.

Figure 7:
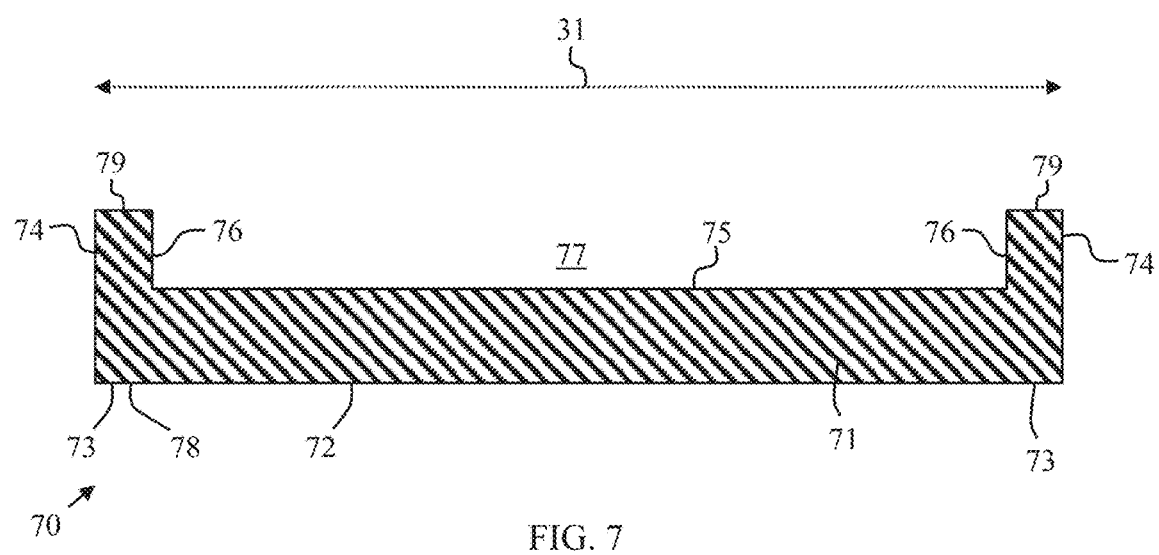
FIG. 7 is a cross-sectional view of an exemplary bottom magnetic shield for use in the shielded semiconductor device of FIGS. 6, 8 and 9 in accordance with embodiments herein.

FIG. 7 illustrates the bottom magnetic shield 70 in isolation to facilitate description. As shown, the bottom magnetic shield 70 is generally cup-shaped, with a lateral-extending main body portion 71 having a central portion 72 and peripheral portions 73. Further, the bottom magnetic shield 70 includes sidewall shield portions 74 over the peripheral portions 73. In an exemplary embodiment, the sidewall shield portions 74 and main body portion 71 are integral, i.e., formed from a same material and without joints or fixed interfaces therebetween. The main body portion 71 has a recess surface 75 and each sidewall shield portion 74 has an inner sidewall 76. Together, the recess surface 75 and inner sidewalls 76 partially bound a hollow 77 formed in the cup-shaped bottom magnetic shield 70.

The bottom magnetic shield 70 includes a bottom surface 78 of the main body portion 71 and top surfaces 79 of the sidewall shield portions 74. The bottom magnetic shield 70 has a thickness between surface 78 and surface 75 of from about 0.25 to about 0.5 mm, such as about 0.35 mm. Further, the bottom magnetic shield 70 has a thickness or height between surface 75 and surface 79 of from about 0.1 to about 0.3 mm, such as about 0.22 mm.

As shown, the bottom magnetic shield 70 has the same length 31 as the top magnetic shield 30. Length 31 is greater than the length 16 of the substrate 12. In an exemplary embodiment, the length 31 of the bottom magnetic shield 70 is from about 8 to about 10 mm, such as about 9.035 mm.

Referring back to FIG. 6, the exemplary bottom magnetic shield 70 is attached to the substrate 12 and to the top magnetic shield 30 using an adhesive 80. An exemplary adhesive 80 may be a magnetic epoxy. Other suitable materials may be utilized for the adhesive 80. In an exemplary embodiment, the adhesive 80 has a thickness of from about 0.03 to about 0.1 mm, such as about 0.05 mm.

In an exemplary embodiment, the adhesive 80 is dispensed onto the bottom magnetic shield 70 via a plasma dispensing process. Specifically, the adhesive 80 is dispensed onto the surfaces 79 of the sidewall shield portions 74 and onto a central region 82 of the recess surface 75. Then, the adhesive 80 is contacted to the outer peripheral regions 36 of the top magnetic shield 30 and to the bottom surface 15 of the substrate 12.

As a result, substrate 12 is located at least partially within the hollow 77 of the bottom magnetic shield 70. Further, gaps 85 are formed between the edges 17 and 18 of the substrate 12 and the inner sidewalls 76 of the sidewall shield portions 74. The gaps 85 are completely bounded, i.e., surrounded, by the substrate 12, top magnetic shield 30, bottom magnetic shield 70, and adhesives 40 and 80. In an exemplary embodiment, each gap 85 has a width of from about 0.02 to about 0.1 mm, such as about 0.05 mm, and a height of from about 0.2 to about 0.4 mm, such as about 0.27 mm.

Figure 8:
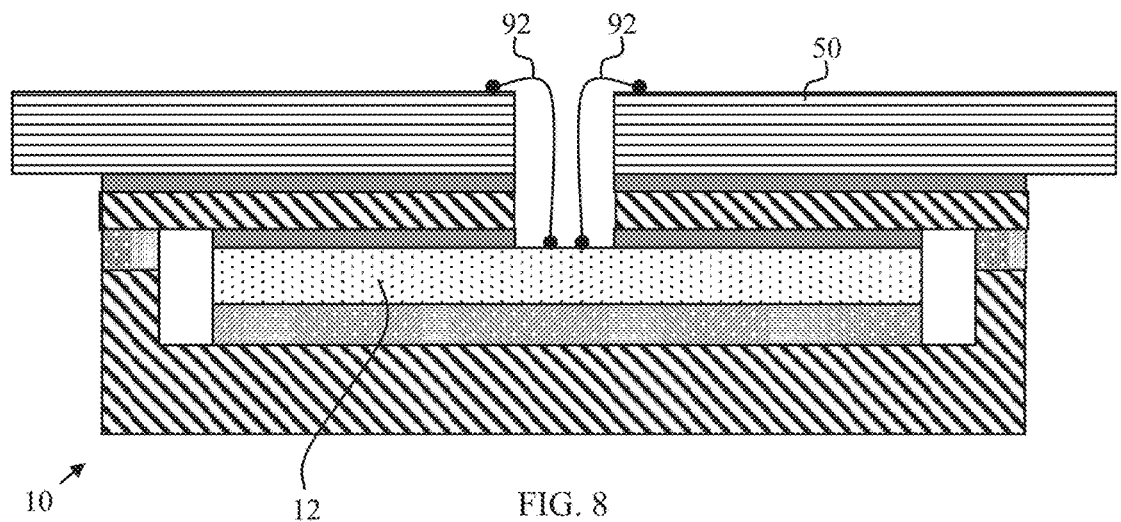
Figure 9:
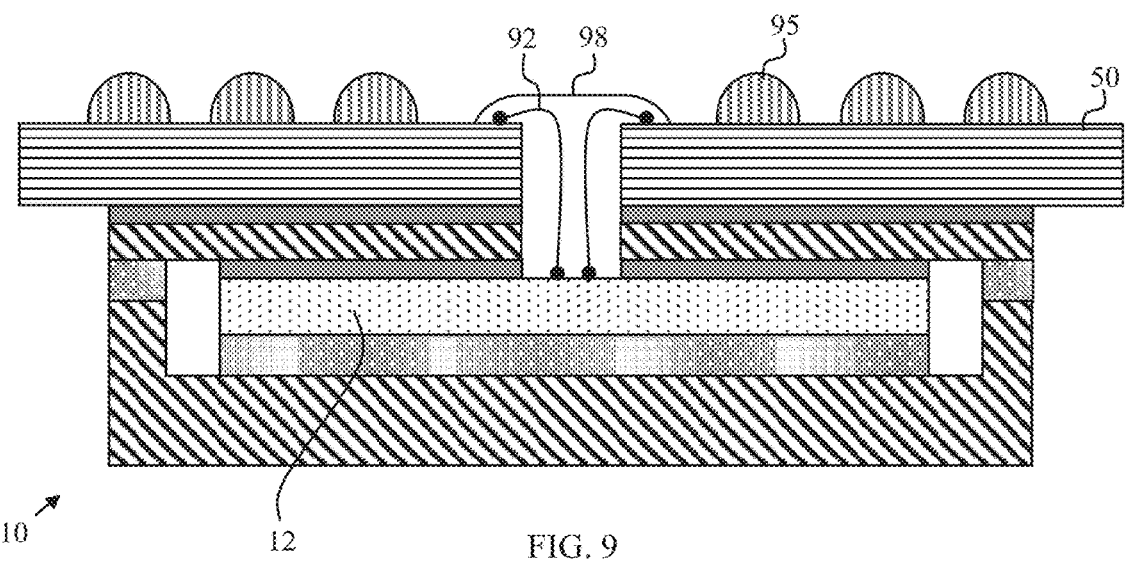

The method continues in FIG. 8 with a wire bonding process to form electrical connections 92 to components on the substrate 12 and to the package substrate 50. Then, in FIG. 9, a bumping process is performed to form conductive bumps 95 on the package substrate 50. Exemplary conductive bumps 95 are solder balls. Further, an insulating material 98 is deposited over and electrical connections 92 to fill the opening and protect the electrical connections from disconnection. An exemplary insulating material is a glob top. As used in the industry, glob tops refer to encapsulations that protect fragile semiconductor die and wire bonds. Glob tops are placed over chips as an environmental barrier, mechanical reinforcement, or tamper proof layer. Typically glob tops include a thixotropic material to form a dome of protection over a semiconductor and wire bonds and may further include a low viscosity epoxy.

As a result of the processing described, a shielded semiconductor device 10 is provided. The exemplary shielded semiconductor device 10 includes a cup-shaped magnetic shield defining a hollow, a magnetoresistive random access memory (MRAM) die located at least partially within the hollow of the cup-shaped magnetic shield, and a top magnetic shield located over the MRAM die, such that the semiconductor device 10 is magnetically shielded in substantially all directions.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A magnetically shielded semiconductor device comprising:
    a substrate having a top surface and a bottom surface;
    an electromagnetic-field-susceptible semiconductor component located in the substrate;
    a top magnetic shield located over the top surface of the substrate, wherein the top magnetic shield is formed with an opening;
    a package substrate mounted to the top magnetic shield, wherein the package substrate defines a void vertically aligned with the opening of the top magnetic shield such that the package substrate lies free from directly disposing over the opening of the top magnetic shield;
    a bottom magnetic shield located under the bottom surface of the substrate; and
    a sidewall magnetic shield located between the top magnetic shield and the bottom magnetic shield.

2. The magnetically shielded semiconductor device of claim 1 wherein the electromagnetic-field-susceptible semiconductor component includes a ferromagnetic memory cell.

3. The magnetically shielded semiconductor device of claim 1 wherein the electromagnetic-field-susceptible semiconductor component includes a magnetoresistive random access memory (MRAM) component.

4. The magnetically shielded semiconductor device of claim 1 wherein the sidewall magnetic shield is integral with the bottom magnetic shield, and wherein magnetic epoxy interconnects the sidewall magnetic shield and the top magnetic shield.

5. The magnetically shielded semiconductor device of claim 1 wherein a layer of magnetic epoxy interconnects the bottom surface of the substrate and the bottom magnetic shield.

6. The magnetically shielded semiconductor device of claim 1 wherein a layer of magnetic epoxy interconnects the top surface of the substrate and the top magnetic shield.

7. The magnetically shielded semiconductor device of claim 1 wherein:
    the substrate has a first edge distanced from a second edge by a chip length;
    the top magnetic shield has a first end distanced from a second end by a first length greater than the chip length;
    the bottom magnetic shield has a first end distanced from a second end by a second length greater than the chip length;
    a first portion of the sidewall magnetic shield has an inner surface distanced from the first edge by a first gap; and
    a second portion of the sidewall magnetic shield has an inner surface distanced from the second edge by a second gap.

8. The magnetically shielded semiconductor device of claim 1 wherein the magnetically shielded semiconductor device further comprises wire connections coupled to the semiconductor component and to an upper surface of the package substrate, wherein the wire connections extend from the top surface, through the opening in the top magnetic shield, and through the void in the package substrate.

9. The magnetically shielded semiconductor device of claim 8 wherein the top magnetic shield is mounted to the package substrate.

10. The magnetically shielded semiconductor device of claim 1 wherein the electromagnetic-field-susceptible semiconductor component includes a magnetic tunnel junction (MTJ) array, and wherein the magnetically shielded semiconductor device further comprises wire connections coupled to the semiconductor component and to an upper surface of the package substrate, wherein the wire connections extend through the opening in the top magnetic shield and through the void in the package substrate.

11. A magnetically shielded semiconductor device comprising:
    a cup-shaped magnetic shield defining a hollow;
    a magnetoresistive random access memory (MRAM) die located at least partially within the hollow of the cup-shaped magnetic shield;
    a second magnetic shield located over the MRAM die, wherein the second magnetic shield is formed with an annular slot opening completely removing a central portion of the second magnetic shield from an outer annular portion of the second magnetic shield; and a package substrate mounted on the second magnetic shield, wherein the package substrate defines an opening vertically aligned with the annular slot opening of the second magnetic shield.

12. The magnetically shielded semiconductor device of claim 11 wherein magnetic epoxy interconnects the cup-shaped magnetic shield and the second magnetic shield.

13. The magnetically shielded semiconductor device of claim 11 wherein the cup-shaped magnetic shield has a recess surface, and wherein the magnetically shielded semiconductor device further comprises a layer of magnetic epoxy interconnecting the MRAM die and the recess surface.

14. The magnetically shielded semiconductor device of claim 11 wherein the magnetically shielded semiconductor device further comprises a layer of magnetic epoxy interconnecting the MRAM die and the second magnetic shield.

15. The magnetically shielded semiconductor device of claim 11 wherein:
   the MRAM die has a first edge distanced from a second edge by a chip length;
   the second magnetic shield has a first end distanced from a second end by a first length greater than the chip length;
   the cup-shaped magnetic shield has a first end distanced from a second end by a second length greater than the chip length;
   the cup-shaped magnetic shield has a first inner sidewall surface distanced from the first edge by a first gap; and
   the cup-shaped magnetic shield has a second inner sidewall surface distanced from the second edge by a second gap.

16. The magnetically shielded semiconductor device of claim 11 wherein the magnetically shielded semiconductor device further comprises wire connections coupled to the MRAM die and extending from the MRAM die and through the annular slot opening in the second magnetic shield.

17. The magnetically shielded semiconductor device of claim 11 further comprising:
   a package substrate, wherein the second magnetic shield is mounted to the package substrate and wherein the package substrate defines an opening aligned with the annular slot opening in the second magnetic shield; and
   wire connections coupled to the MRAM die and to the package substrate, wherein the wire connections extend from the MRAM die and through the annular slot opening to the package substrate.

18. The magnetically shielded semiconductor device of claim 11 wherein the MRAM die includes a magnetic tunnel junction (MTJ) array, and wherein the magnetically shielded semiconductor device further comprises:
   a package substrate, wherein the second magnetic shield is mounted to the package substrate, and wherein the package substrate defines an opening aligned with the annular slot opening in the second magnetic shield; and
   wire connections coupled to the MRAM die and to the package substrate, wherein the wire connections extend from the MRAM die and through the annular slot opening to the package substrate.

19. A magnetically shielded semiconductor device comprising:
   a cup-shaped magnetic shield defining a hollow;
   an array of magnetic tunnel junction (MTJ) cells located in a magnetoresistive random access memory (MRAM) die, wherein the MRAM die is located at least partially within the hollow of the cup-shaped magnetic shield;
   a second magnetic shield having an opening located over the MRAM die;
   a package substrate mounted to the second magnetic shield and having an upper surface, wherein the package substrate defines an opening vertically aligned with the opening of the second magnetic shield; and
   wire connections coupled to the MRAM die and to the upper surface of the package substrate, wherein the wire connections are free from disposing between the package substrate and the second magnetic shield.

20. The magnetically shielded semiconductor device of claim 19 wherein the second magnetic shield is formed with an opening, wherein the package substrate is formed with a void, and wherein the wire connections extend from the MRAM die, through the opening in the second magnetic shield and through the void in the package substrate.

* * * * *